(12) United States Patent
Tanigawa et al.

(10) Patent No.: US 11,562,774 B2
(45) Date of Patent: Jan. 24, 2023

(54) SEMICONDUCTOR DEVICE HAVING A MEMORY AND METHOD OF CONTROLLING THE SAME BETWEEN OPERATION MODES

(71) Applicant: RENESAS ELECTRONICS CORPORATION, Tokyo (JP)

(72) Inventors: Koichi Tanigawa, Tokyo (JP); Takayoshi Shiraishi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/231,572

(22) Filed: Apr. 15, 2021

(65) Prior Publication Data

US 2022/0335985 A1    Oct. 20, 2022

(51) Int. Cl.
*G11C 5/14* (2006.01)
*G11C 11/417* (2006.01)

(52) U.S. Cl.
CPC .............. *G11C 5/148* (2013.01); *G11C 5/147* (2013.01); *G11C 11/417* (2013.01)

(58) Field of Classification Search
CPC ........ G11C 5/148; G11C 5/147; G11C 11/417
See application file for complete search history.

(56) References Cited

U.S. PATENT DOCUMENTS

| | | | |
|---|---|---|---|
| 7,701,764 B2 * | 4/2010 | Nguyen | G11C 16/10 365/185.11 |
| 8,837,238 B2 | 9/2014 | Matsumura et al. | |
| 2010/0188922 A1 * | 7/2010 | Nakaoka | G11C 5/147 365/227 |
| 2012/0185687 A1 * | 7/2012 | Matsumura | G06F 1/3275 713/100 |
| 2020/0141998 A1 * | 5/2020 | Kim | G01R 31/31701 |

FOREIGN PATENT DOCUMENTS

JP     5580751 B2     8/2014

* cited by examiner

*Primary Examiner* — Khamdan N. Alrobaie
(74) *Attorney, Agent, or Firm* — McDermott Will & Emery LLP

(57) ABSTRACT

The semiconductor device 1 comprises a processor 2, a memory connected to the processor and a control circuit, and comprises an active operation mode and a standby operation mode. The memory comprises a normal mode and a RS mode lower power consumption than the normal mode. The memory comprises SRAMs 7_0 to 7_5 which includes a mode terminal RS_T supplied with mode instruction signals RS1_0 to RS1_5 specifying the normal mode or the RS mode, respectively. The control circuit supplies the mode instruction signals specifying the normal mode to the mode terminal of the SRAMs 7_0 to 7_2 in transition period which the semiconductor device transitions from the standby operation mode to the active operation mode. And the control circuit supplies the mode instruction signals specifying the normal mode to the mode terminal of the SRAMs 7_3 to 7_5 after transition to the active operation mode.

10 Claims, 8 Drawing Sheets

SEMICONDUCTOR DEVICE HAVING A MEMORY AND METHOD OF CONTROLLING THE SAME BETWEEN OPERATION MODES

BACKGROUND

The present invention relates to a semiconductor device and method of controlling the same. For example, the present invention relates to the semiconductor device comprising a memory, and having an active operation mode and a standby operation mode which is a low power consumption than the active operation mode, and method of controlling the same.

The Background of the Invention

There are disclosed techniques listed below.

[Patent Document 1] Japanese Patent No. 5580751B2

Patent Document 1 discloses the semiconductor device comprising a SRAM (Static Random Access Memory) as the memory and having an operation mode of the low power consumption.

An operation mode of the low power consumption is, for example, the standby operation mode. When the semiconductor device with the SRAM is set to the standby operation mode, the SRAM is also set to the operation mode of the low power consumption. In this case, the mode of the low power consumption includes, for example, a resume standby mode (hereinafter, also referred to as a RS mode) in which the storage contents are retained, and the standby mode (hereinafter, referred to as SD mode) in which the stored contents are not retained in order to further reduce the leakage current, and it is the low power consumption.

SUMMARY

The present inventors have examined the semiconductor device provided with such the SRAM. First, studies of the present inventors will be described with reference to the drawings. FIG. 7 is a block diagram showing the configuration of a comparative semiconductor device which has been discussed by the present inventors prior to the present invention. Further, FIG. 8 is a timing diagram showing the operation of the semiconductor device of the comparative example shown in FIG. 7.

The semiconductor device 1 comprises: a processor core 2; a low power mode control circuit 3P; a SRAM control circuit 4P; a regulator control circuit 5P; a regulator 6; SRAMs 7_0 to 7_5; and a plurality of IP cores (Intellectual Property Cores) 8. Although not particularly limited, each storage capacitance of the SRAM 7_0 to 7_5 is relatively small, for example, 32 Kbyte.

The regulator 6 is controlled by the regulator control circuit 5P, generates an internal power supply voltage Vdd from the external power supply voltage Vcc and supplies it to a power supply line 9. The SRAMs 7_0 to 7_5 and the IP cores 8 are connected to the power supply line 9. The SRAMs 7_0 to 7_5 and the IP cores 8 operate using the internal power supply voltage Vdd in the power supply line 9 as an operating voltage. In FIG. 7, as the low power consumption modes, the SRAMs 7_0 to 7_5 are provided with the RS mode. That is, the SRAMs 7_0 to 7_5 includes a mode terminal RS_T respectively. The SRAMs 7_0 to 7_5 are set to the RS mode and set to the low power consumption by, for example, the mode terminal RS_T is supplied with low level mode instruction signals P_0 to P_5. By changing the mode instruction signals P_0 to P_5 from low level to high level, the SRAMs 7_0 to 7_5 transition from the RS mode to a normal mode (hereinafter also referred to as the normal mode).

When the semiconductor device 1 is set to the standby operation mode, the SRAM control circuit 4P outputs the low level mode instruction signals P_0 to P_5. When the semiconductor device 1 makes a transition from the standby operation mode to the active operation mode, the SRAM control circuit 4P changes the low level mode instruction signals P_0 to P_5 to high level. Thus, the SRAMs 7_0 to 7_5 transition from the RS mode to the normal mode.

The semiconductor device 1 transitions from the standby operation mode to the active operation mode, for example, by the generation of a wakeup event 10.

In response to the occurrence of the wakeup event 10, when the SRAM control circuit 4P simultaneously changes all mode instruction signals P_0 to P_5 from low level to high level, for example, the SRAMs 7_0 to 7_5 start operating at the same time. Thus, the rush current of large will flow on the power supply line 9, the potential in the power supply line 9 is greatly reduced. This drop in potential can prevent at least one of the SRAMs 7_0 to 7_5 or the IP cores 8 from working properly.

In order to prevent malfunction of at least one of the SRAMs or the IP cores, the present inventors have considered that the SRAM control circuit 4P of the comparative examples sequentially changes the mode instruction signals P_0 to P_5 from the low level to the high level as shown in FIG. 8. That is, when the wakeup event 10 occurs at time t0, in the wakeup time between time t0 and time t1, the SRAM control circuit 4P changes the mode instruction signals from a low level to a high level in the order of the mode instruction signals P_0 to P_5. Thus, a large rush current is suppressed from flowing through the power supply line 9, it is possible to suppress the malfunction. However, there arises a problem that a wakeup time (wakeup time from SSTBY) from the standby operation mode (SSTBY) to the active operation mode (ACTV) becomes longer.

In FIG. 8, 3P_ST indicates the state of the low power mode control circuit 3P, and 4P_ST indicates the state of the SRAM control circuit 4P. Also, in FIG. 8, the state RS of the SRAM control circuit 4P indicates that the SRAM is in the RS mode state, the state RS release sequence indicates that the RS mode is released of the SRAMs, and Normal indicates that SRMAs are in the normal mode state. Of course, the mode may be the SD mode instead of the RS mode.

The semiconductor device according to one embodiment described herein is as follows.

A semiconductor device comprising: a processor; and a memory connected to the processor. The semiconductor device comprises; a first operation mode; and a second operation mode lower in a power consumption than the first operation mode. The memory comprises a first memory mode and a second memory mode lower in the power consumption than first memory mode, and comprises a plurality of memory circuits including a first memory circuit and a second memory circuit. The plurality of memory circuits includes a mode terminal supplied with the mode instruction signal specifying the first memory mode or the second memory mode, and a power supply terminal, respectively. The semiconductor device comprises; a power supply line connected to the power supply terminal of each of the plurality of memory circuits, and a control circuit supplies the mode instruction signals specifying the first memory mode to the mode terminal of the first memory circuit in the transition period of the semiconductor device makes transition from the second operation mode to the first operation mode, and supplies the mode instruction signals specifying the first memory mode to the mode terminal of the second memory circuit after the semiconductor device makes transition to the first operation mode, in response to the transition from the second operation mode to the first operation mode.

Other objects and novel features will become apparent from the description of this specification and the accompanying drawings.

DETAILED DESCRIPTION

Figure 1:
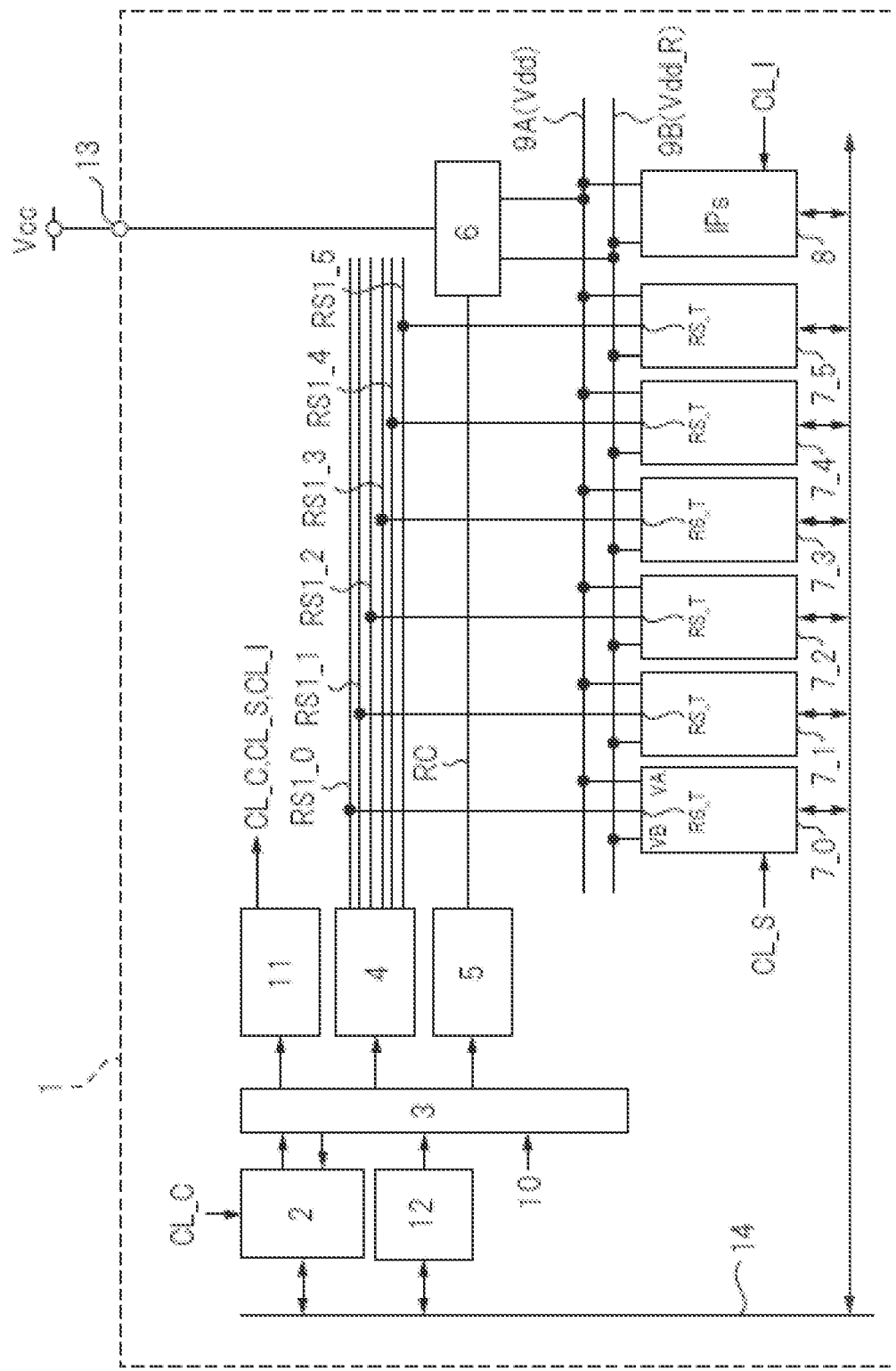
FIG. 1 is a block diagram showing the configuration of a semiconductor device according to first embodiment.

Embodiments of the present invention will be described below with reference to the drawings. It is to be noted that the disclosure is merely an example, and those skilled in the art can easily conceive of appropriate changes while maintaining the gist of the invention are naturally included in the scope of the invention.

In this specification and each drawing, the same reference numerals are assigned to the same elements as those described above with reference to the preceding drawings, and detailed description thereof may be omitted as appropriate.

First Embodiment

<Structure of Semiconductor Device>

FIG. 1 is a block diagram showing the configuration of a semiconductor device according to first embodiment. In the figure, denotes the semiconductor device. In first embodiment, a microcontroller including a processor core (hereinafter, also simply referred to as a processor) and the SRAM is exemplified as the semiconductor device 1, but the microcontroller is not limited thereto.

Although the semiconductor device 1 includes a plurality of circuit blocks, in order to avoid complicated drawings, only the circuit blocks required for explanation are drawn in figure. In FIG. 1, 2 denotes the processor, 3 denotes a low power mode control circuit (hereinafter also referred to as the LPM control circuit), 4 denotes a SRAM control circuit, 5 denotes a regulator control circuit, 6 denotes a regulator, 7_0 to 7_5 denote the SRAMs, and 8 denotes a plurality of the IP cores. And 11 denotes a clock control circuit, 12 denotes an RS mode skip register (hereinafter also referred to as a RS register), 13 denotes an external power supply terminal, and 14 denotes an internal bus. The semiconductor device 1 is provided the external power supply voltage Vcc through the external power supply terminal 13. The circuit blocks inside the semiconductor device 1 operates at least one of the internal power supply voltage Vdd formed on the basis of the external power supply voltage Vcc or the external power supply voltage Vcc as a power supply voltage.

The processor 2, the SRAMs 7_0 to 7_5, the IP cores 8 and a RS register 12 are connected to a shared internal bus 14. The processor 2 accesses the SRAMs 7_0 to 7_5 via the internal bus 14, for example, when executing a program, and writes or reads data to or from the SRAMs 7_0 to 7_5. The processor 2 also accesses the RS register 12 via the internal bus 14 to write data to the RS register 12 or to read data from the RS register 12.

FIG. 1 shows an example in which six SRAMs are provided, but the example is not limited to this number. Instead of six SRAMs, a single SRAM with a large storage capacitance may be provided in the semiconductor device 1, but it is preferable to provide a plurality of the SRAMs with a small storage capacitance (e.g., 32 Kbyte) from the viewpoint of accessibility or flexibility. In the following discussion, each of the small SRAMs 7_0 to 7_5 of the storage capacitance is referred to as a memory circuit. And the large SRAM of the storage capacitance configured by these SRAMs 7_0 to 7_5 is sometimes referred to as the memory.

The LPM control circuit 3 is connected to the processor 2, the RS register 12, the SRAM control circuit 4, the regulator control circuit 5 and the clock control circuit 11. The LPM control circuit 3 controls the SRAM control circuit 4, the regulator control circuit 5 and the clock control circuit 11 according to the data from the processor 2 and the data from the RS register 12 and a wakeup event 10. The processor 2 is controlled by the LPM control circuit 3.

The SRAM control circuit 4 generates the mode instruction signals RS1_0 to RS1_5 in accordance with an instruction from the LPM control circuit 3, and outputs them to a mode terminal RS_T of the SRAMs 7_0 to 7_5, which will be described later. The regulator control circuit 5 also generates a regulator control signal RC in accordance with instruction from the LPM control circuit 3 and supplies it to the regulator 6.

The clock control circuit 11 generates and outputs clock signals CL_C, CL_S, CL_I, and the like in accordance with an instruction from the LPM control circuit 3. The clock signal CL_C is supplied to the processor 2, and the processor 2 operates in synchronization with the clock signal CL_C. The clock signal CL_S is supplied to the SRAMs 7_0 to 7_5, and the SRAMs 7_0 to 7_5 operate in synchronization with the clock signal CL_S. A clock signal CL_I is supplied to the IP cores 8, and the IP cores 8 operate in synchronization with the clock signal CL_I.

The regulator 6 is connected to the external power supply terminal 13 and power supply lines 9A and 9B. The regulator 6 generates internal power supply voltage Vdd and an internal power supply voltage Vdd_R lower than the internal power supply voltage Vdd from the external power supply voltage Vcc supplied from the external power supply terminal 13 by voltage conversion such as step-down, in accordance with the regulator control signal RC. And the regulator 6 provides the internal power supply voltage Vdd and the internal power supply voltage Vdd_R to the power supply lines 9A and 9B. Without particular limitation, the internal power supply voltage Vdd is about 1.18V, the internal power supply voltage Vdd_R is about 1.0V.

The SRAMs 7_0 to 7_5 have the same configuration. The SRAMs 7_0 to 7_5 include a power supply terminal VA connected to the power supply line 9A, a power supply terminal VB connected to the power supply line 9B, the mode terminal RS_T supplied with the mode instruction signal, and the clock terminal supplied with the clock signal CL_S, respectively. Incidentally, in FIG. 1, only for the SRAM 7_0, the power supply terminals VA, VB and the clock terminal is shown, the other SRAMs also include these terminals in the same manner.

The semiconductor device 1 according to first embodiment includes a plurality of operation modes. Next, an active operation mode (ACTV) and a standby operation mode (SSTBY) of these operation modes will be described. In the present specification, the active operation mode is also referred to as first operation mode, and the standby operation mode is also referred to as second operation mode.

<<Operation Mode of the Semiconductor Device 1>>

The active operation mode is a normal operation mode. For example, the processor 2 executes a program to perform a predetermined process in the active operation mode. At this time, the processor 2 accesses the SRAMs 7_0 to 7_5 in the active operation mode. The IP cores 8 also operates to perform a predetermined process in the active operation mode. The standby operation mode, on the other hand, is the operation mode with a low power consumption than the active operation mode.

When the processor 2 instructs the LPM control circuit 3 to transition from the active operation mode to the standby operation mode, the semiconductor device 1 will transition from the active operation mode to the standby operation mode. On the other hand, when the generation of the wakeup event 10 occurs, the LPM control circuit 3 makes to transition the semiconductor device 1 from the standby operation mode to the active operation mode.

Figure 2:
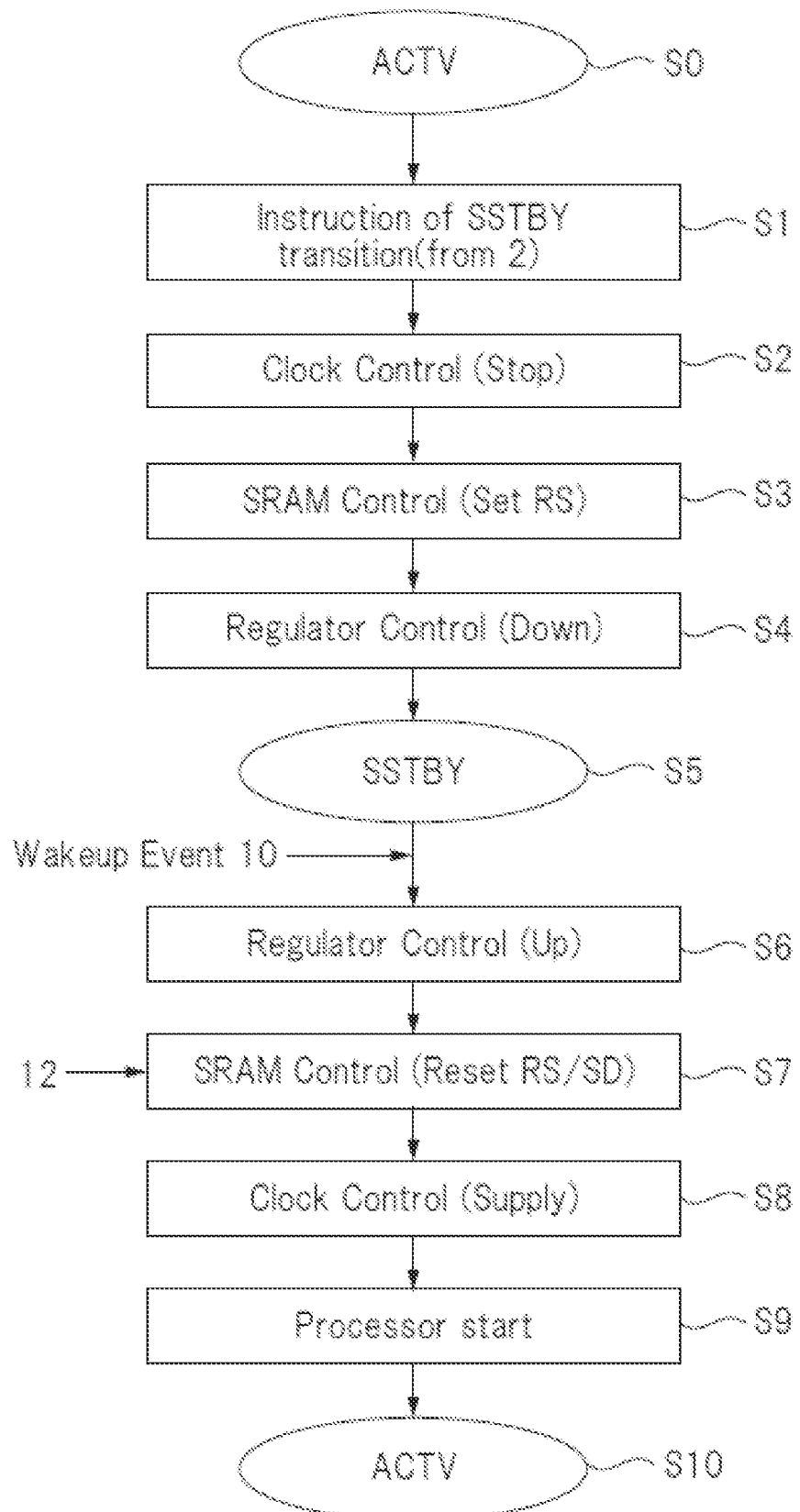
FIG. 2 is a flow chart showing the operation of a LPM control circuit according to first embodiment.

FIG. 2 is a flow chart showing the operation of the LPM control circuit according to first embodiment.

In step S0, it is assumed that the semiconductor device 1 is operating in the active operation mode (ACTV). In step S1, the processor 2 outputs an instruction of the transition for the standby operation mode to the LPM control circuit 3. In step S2, the LPM control circuit 3 controls the clock control circuit 11 to stop the clock signals CL_C, CL_S, and CL_I. Next, in step S3, the LPM control circuit 3 instructs the SRAM control circuit 4 to output the mode instruction signals RS1_0 to RS1_5 such that the SRAM becomes a RS mode. Further, in step S4, the LPM control circuit 3 controls the regulator control circuit 5. The regulator control circuit 5, under the control of the LPM control circuit 3, outputs the regulator control signal RC which causes the regulator 6 to output a lower internal power supply voltage Vdd_R.

As a result, in step S5, the clock signals CL_C, CL_S, and CL_I are stopped, and the regulator 6 outputs a low internal power supply voltage Vdd_R. The SRAMs 7_0 to 7_5 are transition to the RS mode. The processor 2, the IP cores 8 and the SRAMs 7_0 to 7_5 are deactivated because no clock signals are supplied, and the semiconductor device 1 is set to the standby operation mode (SSTBY) of the low power consumption. At this time, the SRAMs 7_0 to 7_5 are supplied with lower level internal power supply voltage Vdd_R, so that SRAMs holds the data.

In the standby operation mode, when the wakeup event 10 occurs, the LPM control circuit 3 causes the semiconductor device 1 to transition from the standby operation mode to the active operation mode. That is, in step S6, the LPM control circuit 3, with respect to the regulator control circuit 5, and outputs the regulator control signal RC so as to output the internal power supply voltage Vdd to the regulator 6.

Next, in step S7, the LPM control circuit 3 instructs the SRAM control circuit 4 to output the mode instruction signal to transition the SRAMs not specified in this specified information from the RS mode to the normal mode based on the data (specified information) from the RS register 12. In step S8, the LPM control circuit 3 instructs the clock control circuit 11 to output the clock signals CL_C, CL_S, and CL_I. Thereafter, in step S9, the LPM control circuit 3 starts the operation of the processor 2.

Thus, in step S10, the processor 2 operates synchronously with the clock signals CL_C, CL_S, and CL_I (the active operation mode). And the SRAMs and the IP cores 8 transition to the normal mode also operate synchronously with the clock signals CL_C, CL_S, and CL_I (the active operation mode).

Note that in the standby operation mode, when the SRAM is transition to the above-mentioned SD mode instead of the RS mode, in step S3 may transition the SRAMs 7_0 to 7_5 to the SD mode, and transition the SRAMs not specified in the specified information from the SD mode to the normal mode in step S7. In this way, the storage data of the SRAM is lost, but the data can be further reduced in a power consumption.

<<Configuration and Modes of SRAM>>

Next, the configuration and mode (operation mode) of the SRAMs 7_0 to 7_5 will be described. In this specification, the mode of the SRAM is also referred to as the memory mode in order to distinguish it of the SRAMs from modes of the operation mode of the semiconductor device 1.

The SRAM has the normal mode (the first memory mode) and the RS mode (a second memory mode) as the operation mode (the memory mode). Whether the SRAM is set to the normal mode or the RS mode depends on the mode instruction signal supplied to the mode terminal RS_T. In the RS mode, as described above, the SRAM is the low power consumption than the normal mode while holding data. Of course, the present invention is not limited only to the RS mode. For example, the SRAM may further include the SD mode (the second memory mode) described above.

Figure 3:
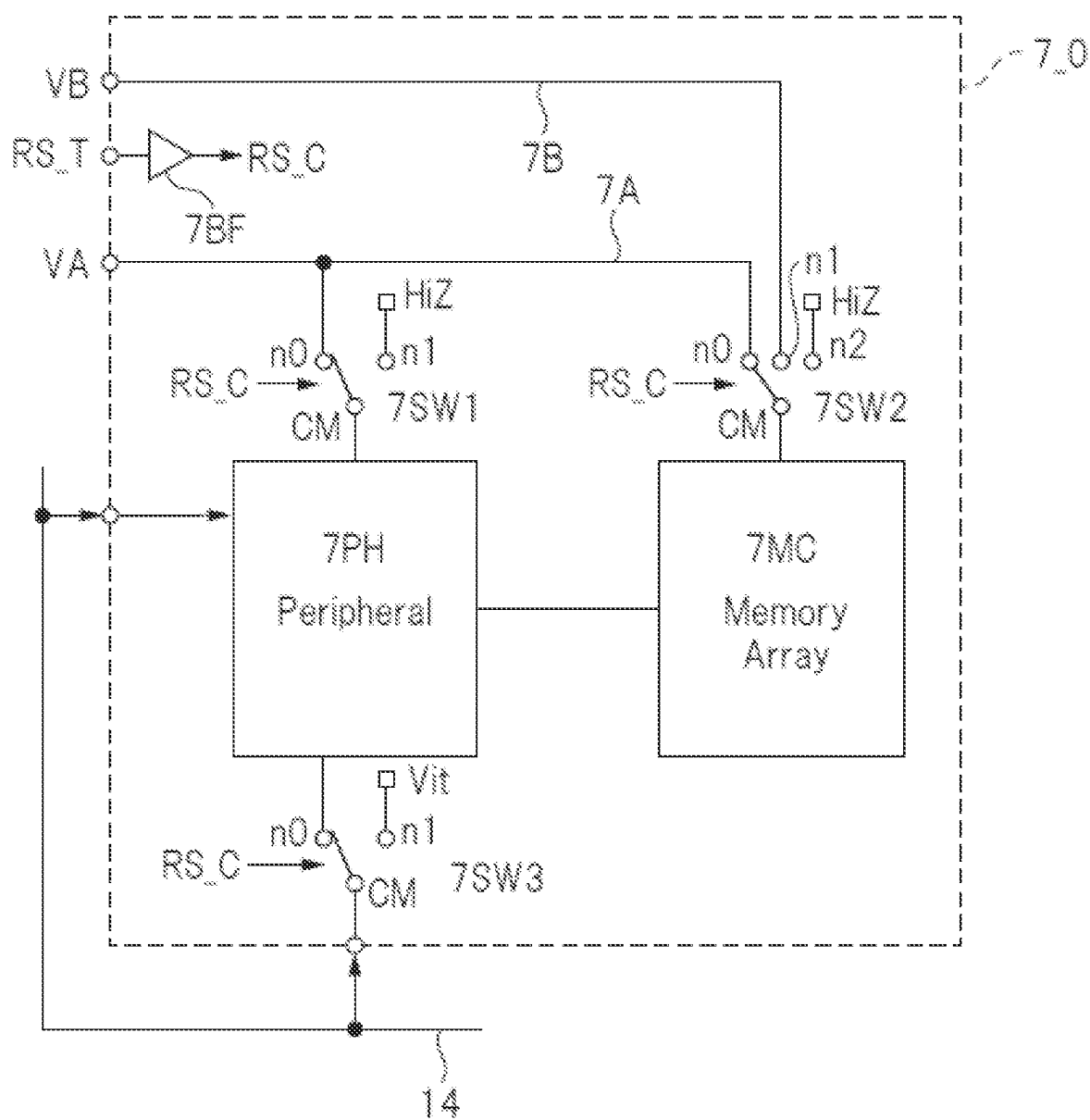
FIG. 3 is a diagram showing a schematic configuration of an exemplary SRAM according to first embodiment.

Since the SRAMs 7_0 to 7_5 have the same configuration as each other, the SRAM 7_0 will be described here as a representative. FIG. 3 is a diagram showing a schematic configuration of an exemplary the SRAM according to first embodiment. The SRAM 7_0 includes a memory array 7MC in which a plurality of memory cells are arranged, peripheral block 7PH, a buffer circuit 7BF, and switches 7SW1 to 7SW3.

Peripheral block 7PH is connected to a power supply line 7A via switch 7SW1. The memory array 7MC is also connected to power supply lines 7A and 7B via the switch 7SW2. The peripheral block 7PH and the memory array 7MC operate using the internal power supply voltage supplied from the power supply line via switch 7SW1 and switch 7SW2 as the operating voltage. Here, the power supply line 7A is connected to the power supply line 9A (shown in FIG. 1) via the power supply terminal VA. And the power supply line 7B is connected to the power supply line 9B (shown in in FIG. 1) via the power supply terminal VB.

The peripheral block 7PH includes a decoder circuit, a sense amplifier, a write circuit, and the like, although not shown. When the internal power supply voltage Vdd is supplied via switch 7SW1, the decoder circuit, the sense amplifier and the write circuit operate as follows. That is, the decoder circuit decodes the address signal from the internal bus 14. And the decoder circuit selects the memory cell of the memory array 7MC according to the address signal. The sense amplifier amplifies the data of the selected memory cell and outputs the amplified data to the internal bus 14 via switch 7SW3. The write circuit writes the data supplied from the internal bus 14 via switch 7SW3 to the selected memory cell.

The buffer circuit 7BF are connected to the mode terminal RS_T. And the buffer circuit 7BF provides a selection signal RS_C according to the mode instruction signal RS1_0 supplied to the mode terminal RS_T (shown is FIG. 1). Switches 7SW1 to 7SW3 are controlled by the selection signal RS_C.

When the mode instruction signal RS1_0 is at a high level so as to specify the normal mode (the first memory mode), each of the common nodes CM of switches 7SW1 to 7SW3 are connected to the node n0. Thus, the memory array 7MC and the peripheral block 7PH operate with the internal power supply voltage Vdd from the power supply line 9A as the operating voltage. Also, the peripheral block 7PH is electrically connected to the internal bus 14 via switch 7SW3. Thus, the SRAM 7_0 operates in accordance with, for example, accessing from the processor 2 (shown in FIG. 1).

On the other hand, when the mode instruction signal RS1_0 is at a low level so as to specify the RS mode (the second memory mode), each of the common nodes CM of switches 7SW1 to 7SW3 are connected to the node n1. Thus, the memory array 7MC operates with the internal power supply voltage Vdd_R from the power supply line 9B as the operating voltage.

The peripheral block 7PH is also electrically isolated from the power supply line 7A by switch 7SW1 and is connected to the high-impedance node (Hi-Z). At this time, switch 7SW3 connects the internal bus 14 to a predetermined internal voltage Vit instead of the peripheral block 7PH. Thus, the peripheral block 7PH is deactivated, and the internal bus 14 is supplied with the predetermined internal voltage Vit instead of the data of the memory cell.

When the peripheral block 7PH becomes inactive, access to the memory array 7MC is not performed. Therefore, the power consumption in the SRAM 7_0 can be reduced. Since the low internal power supply voltage Vdd_R is supplied to the memory array 7MC, the power consumption of the memory array 7MC can be reduced while the data is held.

When SD mode is set to the SRAM 7_0, for example, the SRAM 7_0 is provided with a mode terminal for SD mode (mode terminal SD_T for convenience). Switches 7SW1 to 7SW3 are controlled by the mode instruction signal supplied to the mode terminal SD_T. In the SD mode, switches 7SW1 and 7SW3 connect the common node CM to the node n1, and switch 7SW2 connects the common node CM to the node n2. Thus, each of the memory array 7MC and the peripheral block 7PH become inactive, since they are connected to the high-impedance node (Hi-Z). Consequently, the stored data in the memory array 7MC is not retained, but further reduction of the power consumption is enabled.

<<RS Register>>

Figure 7:
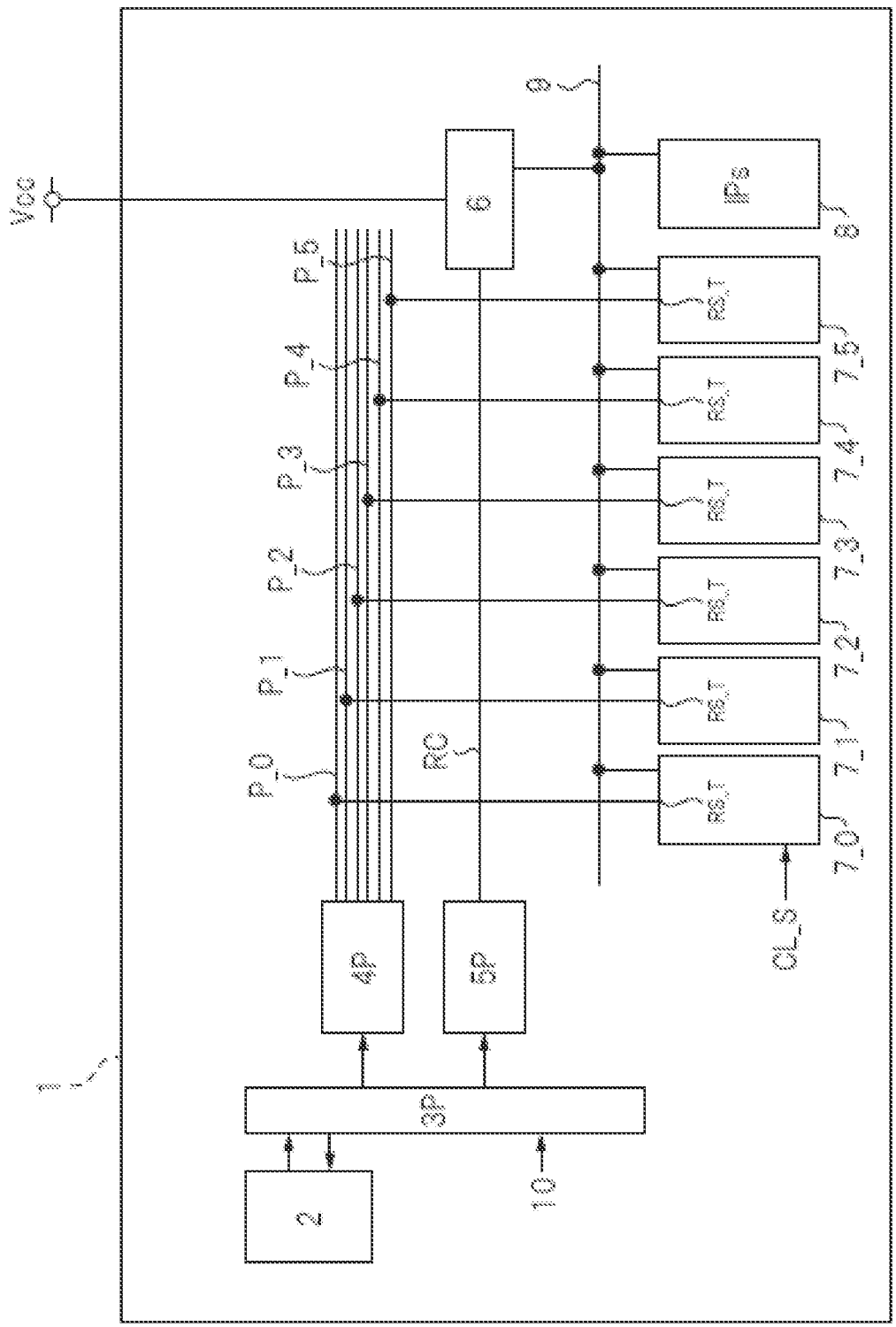
FIG. 7 is a diagram showing the configuration of a comparative semiconductor device.
Figure 8:
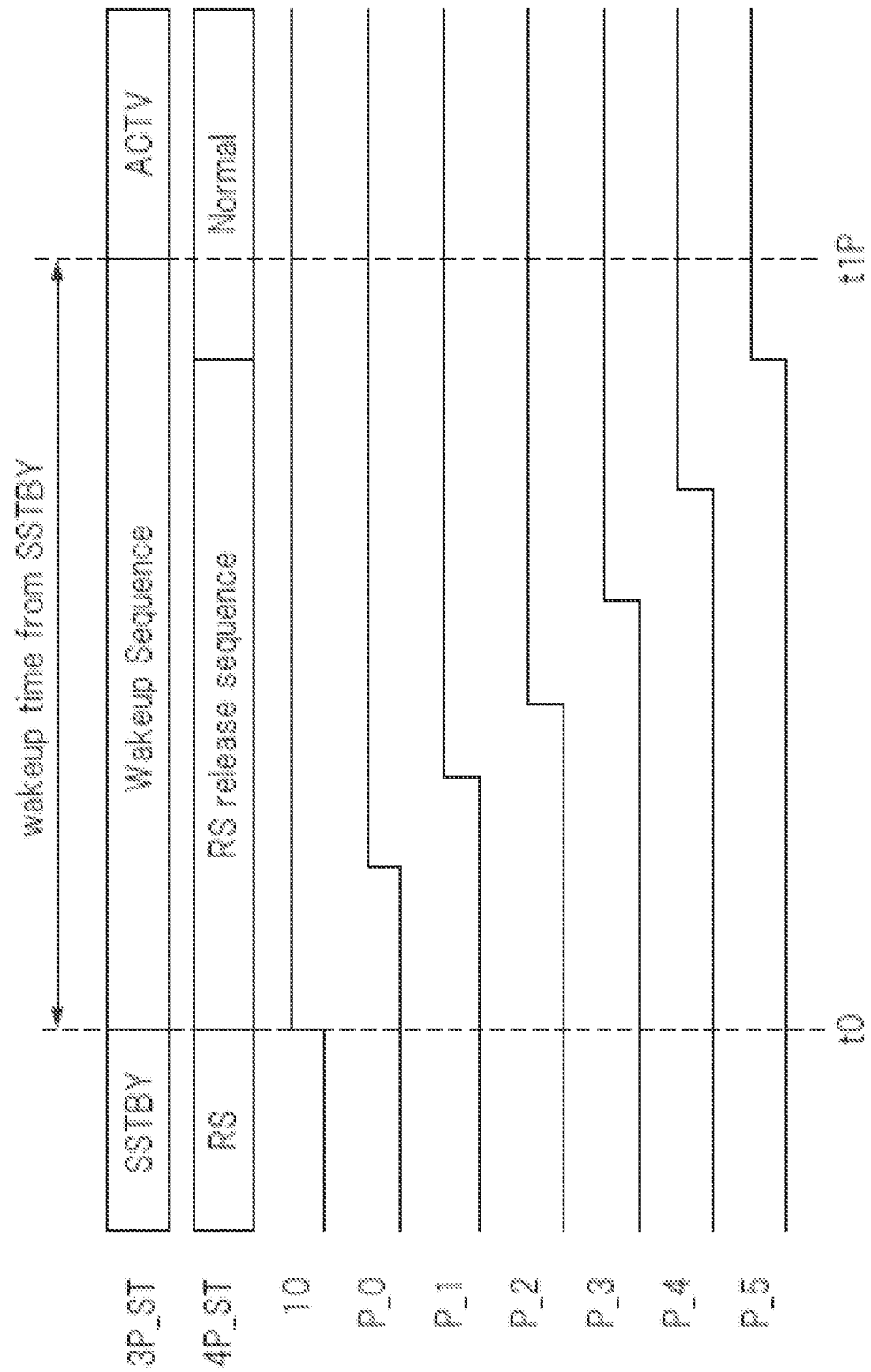
FIG. 8 is a timing chart showing the operation of a semiconductor device of the comparative embodiment.

When the semiconductor device 1 makes transition from the standby operation mode to the active operation mode, the SRAM transitions from the RS mode to the normal mode. But in first embodiment the semiconductor device 1, some SRAMs are transitioned from the RS mode to the normal mode and the remaining the SRAMs are not transition from the RS mode to the normal mode in a transition period from the standby operation mode to the active operation mode. For the SRAM that does not transition to the normal mode, after the semiconductor device 1 transitions to the active operation mode, the necessary SRAMs transition from the RS mode to the normal mode. For example, in the comparative example described with reference to FIG. 7 and FIG. 8, the transition of the memory mode is performed for all SRAMs in the transition period of transition the operation mode of the semiconductor device 1. On the other hand, according to first embodiment, in the transition period, transition of the memory mode is canceled for a part of the SRAMs of the semiconductor device 1. Thus, while suppressing malfunction, it is possible to shorten the transition period of the operation mode of the semiconductor device 1.

According to first embodiment, the RS register 12 of the semiconductor device 1 stores the specified information specifying the SRAMs for canceling transition from the RS mode to the normal mode in shown in FIG. 1. The SRAMs that cancel transition is identified by users, for example, and stored as the specified information in the RS register 12 by the processor 2. The SRAMs that cancel transition updates the specified information stored in the RS register 12 by using the processor 2 when it needs to be accessed after the semiconductor device 1 is turned the active operation mode. That is, the RS register 12 is updated to exclude the specified information that identifies the SRAMs that requires to be accessed from the specified information stored in the RS register 12.

When the wakeup event 10 is occurred, the LPM control circuit 3 controls the SRAM control circuit 4 to transition the SRAMs except for the SRAMs specified by the specified information stored in the RS register 12 from the RS mode to the normal mode by the mode instruction signal. After transition of the semiconductor device 1 to the active operation mode, the LPM control circuit 3 controls the SRAM control circuit 4 to transition the SRAMs specified by the specified information removed by the update from the RS mode to the normal mode when the specified information stored in the RS register 12 is updated.

<<Transition>>

Figure 4:
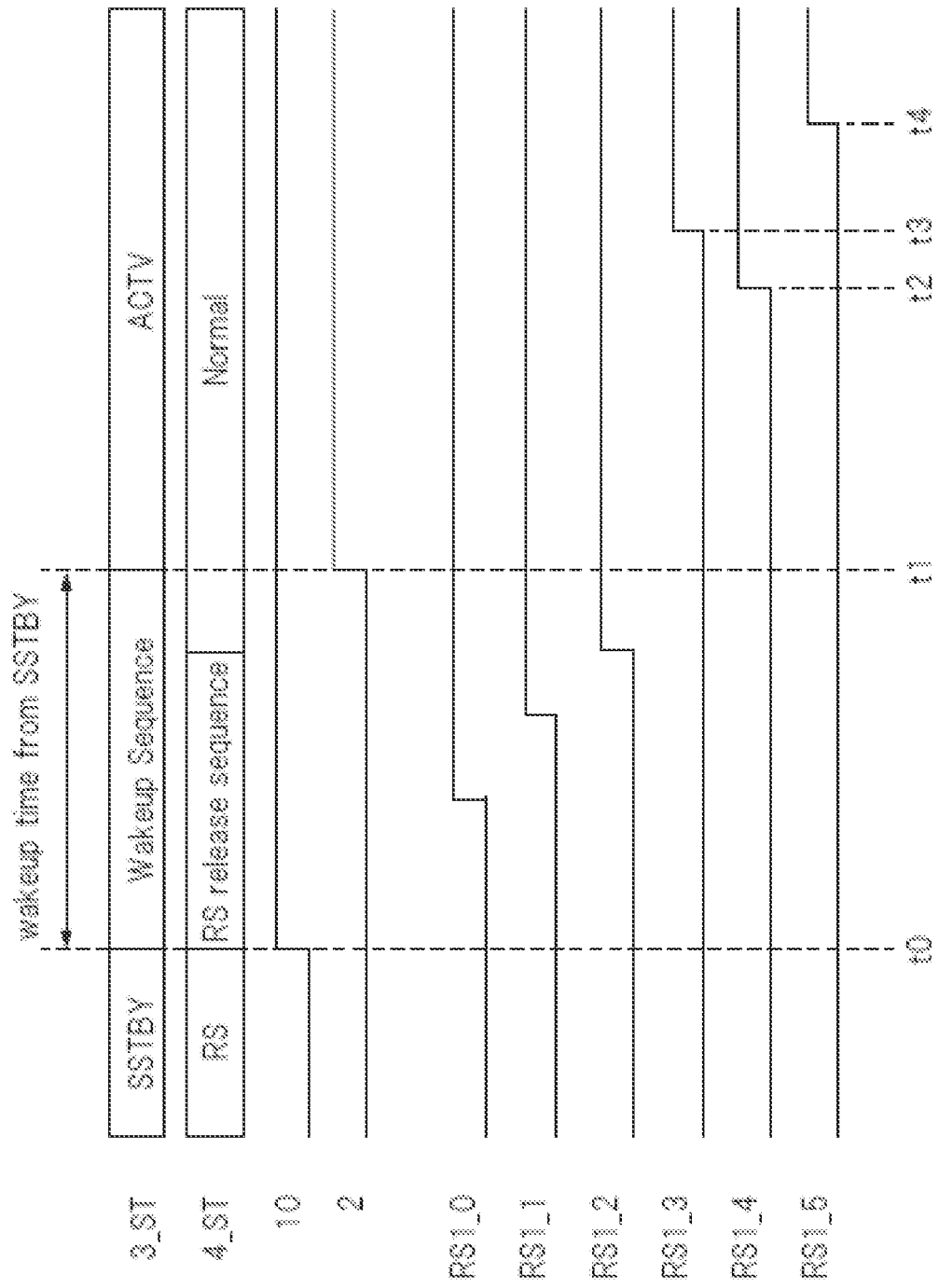
FIG. 4 is a timing chart showing the operation of a semiconductor device according to first embodiment at the time of a transition.

Next, the operation of the semiconductor device 1 according to first embodiment when transition the operation mode will be described. FIG. 4 is a timing chart showing the operation of the semiconductor device according to first embodiment at the time of the transition. In this example, the SRAMs 7_0 to 7_2 (first memory circuit) is transition from the RS mode to the normal mode during the transition period of the operation mode. In addition, the SRAMs 7_3 to 7_5 (second memory circuit) are not transition from the RS mode to the normal mode. This section explains how to cancel transition in the SRAMs 7_3 to 7_5. After the semiconductor device 1 transition to the active operation mode, this section explains how to transition the SRAMs 7_3 to 7_5 from the RS mode to the normal mode.

At time t0, the wakeup event 10 occurs. Thereby, the LPM control circuit 3 starts the wake-up sequence. The RS register 12 contains the specified information that identifies the SRAMs 7_3 to 7_5. Since this specified information is supplied to the LPM control circuit 3, the LPM control circuit 3 instructs the SRAM control circuit 4 to transition the SRAMs 7_0 to 7_2 from the RS mode to the normal mode except for the SRAMs 7_3 to 7_5. In response to this instruction, the SRAM control circuit 4 executes a sequence that releases the RS mode of SRAMs 7_0 to 7_2 (a RS mode release sequence). Specifically, the SRAM control circuit 4 changes from the low level to the high level in the order of the mode instruction signals RS1_0, RS1_1, and RS1_2.

At time t1, the LPM control circuit 3 ends the wake-up sequence and starts the operation of the processor 2. The transition period from the standby operation mode to the active operation mode is from time t0 at which the wakeup event 10 occurred to time t1 at which operation of the processor 2 started. This duration can also be considered as a wakeup time from the standby operation mode.

FIG. 4 shows that the processor 2 is updating the specified information stored in the RS register 12 after time t1 of transition to the active operation mode. That is, the processor 2 updates the specified information that identifies the SRAM 7_4, the specified information that identifies the SRAM 7_3, and the specified information that identifies the SRAM 7_5 to exclude from the specified information stored in the RS register 12. In response to this updating, the LPM control circuit 3 instructs the SRAM control circuit 4 to set the mode instruction signal RS1_4 corresponding to the SRAM 7_4 to the high level at the time t2. Similarly, the LPM control circuit 3 instructs the SRAM control circuit 4 to set the mode instruction signal RS1_3 of the SRAM 7_3 to a high level at time t3. And the LPM control circuit 3 instructs the mode instruction signal RS1_5 of the SRAM 7_5 to a high level at time t4. Thus, after the semiconductor device 1 has transition to the active operation mode at time t1, the SRAMs 7_3 to 7_5 will transition from the RS mode to the normal mode.

In first embodiment, the SRAMs 7_0 to 7_5 of six small storage capacitance are used to store at least one of program or data. Therefore, for example, it is desirable to store predetermined programs or predetermined data to be used by the semiconductor device 1 at the active operation mode in the SRAMs (7_0 to 7_2 in FIG. 4) which transition from the RS mode to the normal mode in the transition period. As a result, when the semiconductor device 1 makes the transition to the active operation mode, predetermined programs can be executed or processes using predetermined data can be executed.

On the other hand, in the SRAMs where the transition from the RS mode is canceled in the transition period (SRMAs 7_3 to 7_5 in FIG. 4), it is desirable to store, for example, at least one of program or data that is required in a timely manner when the semiconductor device 1 is set to the active operation mode. The required program or data can be used by transition the SRAMs (7_3 to 7_5) from the RS mode to the normal mode prior to being needed during the active operation mode. In this situation, the SRAMs which stores programs or data not required by the active operation mode, may stay in the RS mode.

In first embodiment, if the semiconductor device 1 is to be transition from the active operation mode to the standby operation mode after time t4, prior to transition to the standby operation mode, the processor 2 stores the specified information specifying the SRAMs to cancel transition from the RS mode to the normal mode in the RS register 12. As a result, the transition period can be shortened even when transition is returned from the standby operation mode to the active operation mode. The specified information stored in the RS register 12 may be the same or different at all times.

As the specified information stored in the RS register 12, the specified information of the SRAMs that cancels transition from the RS mode to normal operation mode is described as an example. However, the information is not limited to this. For example, in the transition period, the specified information specifying the SRAMs to be transition from the RS mode to the normal mode may be stored in the RS register 12.

Although transition from the RS mode to the normal mode has been exemplified, it may be the transition from the SD mode to the normal mode. In this case, the specified information that specifies the SRAMs for canceling transition from SD mode to the normal mode in the transition period is stored in the SD register same to the RS register 12. The SRAMs specified by the specified information stored in the SD register is not transition from the SD mode to the normal mode in the transition period, so that it is turned transition in the active operation mode.

Second Embodiment

Figure 5:
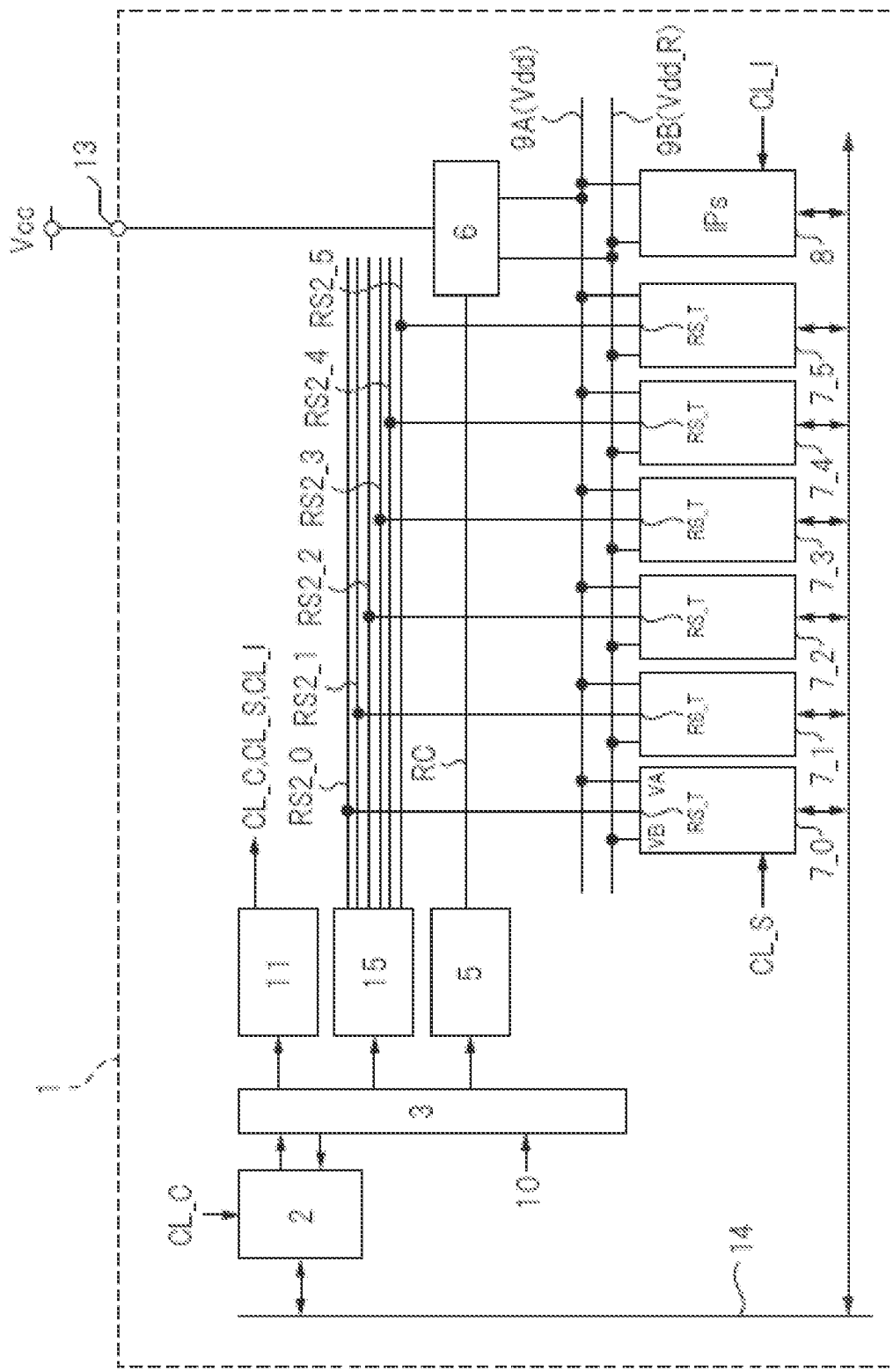
FIG. 5 is a block diagram showing the configuration of a semiconductor device according to second embodiment.
Figure 6:
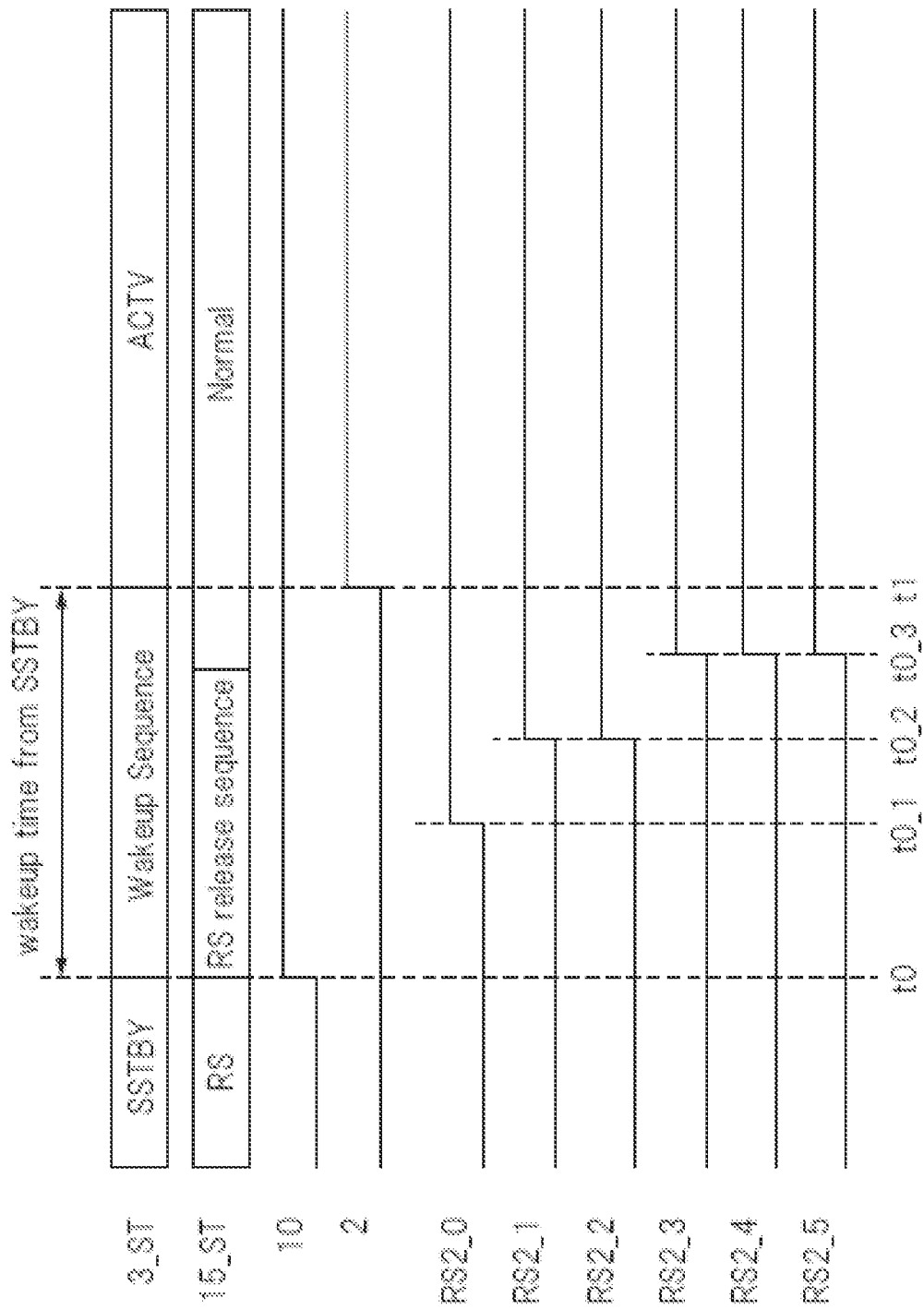
FIG. 6 is a timing diagram showing the operation of a semiconductor device according to second embodiment.

FIG. 5 is a block diagram showing the configuration of the semiconductor device according to second embodiment. FIG. 6 is a timing chart showing the operation of the semiconductor device according to second embodiment.

Since FIG. 5 is similar to FIG. 1, the main differences will be explained. The main difference is that the semiconductor device 1 of FIG. 5 does not have the RS register 12, a SRAM control circuit is changed from that of FIG. 1, and the reference number 15. The SRAM control circuit 15 outputs RS2_0 to RS2_5 instead of RS1_0 to RS1_5 as the mode instruction signals.

Similar to first embodiment, the LPM control circuit 3 starts a wake-up sequence at time t0 when the wakeup event 10 occurs. In this sequence, the LPM control circuit 3 causes the SRAM control circuit 15 to initiate the RS mode release sequence.

In the RS mode release sequence, the SRAM control circuit 15 transition each of the SRAMs 7_0 to 7_5 from the RS mode to the normal mode at the transition period at times t0 to t1. In the transition period, the SRAM control circuit 15 changes each of the mode instruction signals RS2_0 to RS2_5 from a low level to a high level. At this time, the SRAM control circuit 15 changes substantially simultaneously the mode instruction signals so as to transition a plurality of SRAMs from the SRAMs 7_0 to 7_5 from the RS mode to the normal mode.

Specifically, at time t0_1, the SRAM control circuit 15 changes the mode instruction signal RS2_0 so as to transition one SRAM 7_0 (first memory circuit) to the normal mode. Then at time t0_2, the SRAM control circuit 15 changes the mode instruction signals RS2_1 and RS2_2 to cause the normal mode to transition at least two SRAMs (SRAM 7_1 and SRAM 7_2: second memory circuit in FIG. 6). Next, at time t0_3, the SRAM control circuit 15 changes the mode instruction signals RS2_3 to RS2_5 so that at least two SRAMs (in FIG. 6, three SRAMs 7_3 to 7_5: the third memory circuit) are transition to the normal mode. That is, the SRAM control circuit 15 changes the mode instruction signal so that the number of the SRAMs to transition from the RS mode to the normal mode increases over time.

In second embodiment, a plurality of the SRAMs are controlled to transition from the RS mode to the normal mode substantially simultaneously. This can suppress the transition period from becoming longer.

From the viewpoint of potential change in the power supply line 9B, when viewed the SRAMs, the SRAMs for transition from the RS mode to the normal mode can be regarded as a parasitic capacitance connected to the power supply line 9. When many SRAMs are turned transition from the RS mode to the normal mode at substantially the same time, the parasitic capacitance connected to the power supply line 9 is greatly increased, so that a large parasitic capacitance is connected to the power supply line. Because of the charge and discharge of this large parasitic capacitance, the potential at the power supply line 9 will vary greatly. In second embodiment, as shown in FIG. 6, the number of the SRAMs that the RS mode to the normal mode is transition to one SRAM 7_0 first. After that, the number of the SRAMs that transition modes are gradually increased. Thus, the parasitic capacitance connected to the power supply line 9B, will be sequentially increased with time. It is possible to suppress the potential change in the power supply line 9. As a result, it is possible to suppress the occurrence of malfunction.

The number of SRAMs to transition from the RS mode to the normal mode substantially simultaneously is not limited to the number shown in FIG. 6. Further, even if a plurality of the SRAMs is connected to the power supply line, as long as the potential change in the power supply line is acceptable, the number of SRAMs from the RS mode to the normal mode is turned transition first is not limited to one.

In FIG. 5 and FIG. 6, the case of transition from the RS mode to the normal mode has been described, but the same applies to the case of transition from the normal mode to the RS mode. For example, in the normal mode to the RS mode for transition, the transition period may first transition several SRAMs at substantially the same time and then transition one SRAM.

Although the number of the SRAMs to transition from the RS mode to the normal mode is the same as the number of the SRAMs to transition from the normal mode to the RS mode, the present invention is not limited to this. Further, as a mode to be subjected to transition, it may be the SD mode described above. That is, in the above explanation, the RS mode may be replaced with the SD mode.

In first embodiment and second embodiment, from the viewpoint of controlling the SRAMs 7_0 to 7_5, it can be considered that the LPM control circuit 3, the SRAM control circuit 4 (or 15), and the regulator control circuit 5 constitute a control circuit.

Also, in first embodiment, a step that causes the SRAMs 7_0 to 7_2 to transition from the RS mode to the normal mode can be regarded as a first transition step, and a step that causes the SRAMs 7_3 to 7_5 to transition from the RS mode to the normal mode can be regarded as a second transition step.

In addition, in second embodiment, a step that transition the mode (from the RS mode to the normal mode) of one the SRAM 7_0 among the SRAMs 7_0 to 7_5 can be regarded as first step. In this situation, the SRAMs 7_1 and 7_2 can be regarded as the mode (from the RS mode to the normal mode) transition at virtually the same time as step is regarded as a second step, and step that SRAMs 7_3 to 7_5 is transition at virtually the same time as the mode (from the RS mode to the normal mode) can be regarded as a third step.

In this specification, a plurality of inventions other than the inventions described in the claims are described. Representative examples of inventions not described in the claims are listed below.

(A) A control method of a semiconductor device comprising a processor and a plurality of memory circuits coupled to the processor, wherein the plurality of memory circuits comprises a first memory mode and a second memory mode lower in a power consumption than the first memory mode, and wherein the semiconductor device comprises a first operation mode and a second operation mode lower in a power consumption than the first operation mode, wherein the control method comprising the steps of:

(a) transitioning an operation mode of a predetermined memory circuit of the plurality of memory circuits between the first memory mode and the second memory mode, in a transition period of transition an operation mode between the second memory mode and the first memory mode, (b) after step (a), transitioning substantially simultaneously the operation mode of at least two memory circuits of the plurality of memory circuits between the first operation mode and the second operation mode during the transition period.

wherein the step (a) is a first transition step, and wherein the step (b) is a second transition step.

(A-1) The control method according to claim (A), further comprising;

(c) after step (b), transitioning substantially simultaneously the operation mode of at least two memory circuits of the plurality of memory circuits between the first operation mode and the second operation mode during the transition period, wherein the step (c) is a third transition step.

(A-2) The control method according to claim (A-1), wherein the number of memory circuit that the mode transition in the third step is larger than the number of memory circuit that the mode transition in the second step.

(B) A semiconductor device comprising:

a processor; and a memory connected to the processor, a first operation mode; and a second operation mode lower in a power consumption than the first operation mode, wherein the memory comprises a first memory mode and a second memory mode lower in the power consumption than first memory mode, and comprises a plurality of memory circuits including a mode terminal supplied with a mode instruction signal specifying the first memory mode or the second memory mode, and a power supply terminal, respectively, wherein the semiconductor device comprises;

a power supply line connected to the power supply terminal of each of the plurality of memory circuits, and a register storing a specified information specifying the memory circuit which cancels the transition from the second memory mode to the first memory mode or a specified information specifying the memory circuit which transitions from the second memory mode to the first memory mode during the transition period to transition the semiconductor device from the second operation mode to the first operation mode after transition from the second operation mode to the first operation mode.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:

a processor; and a memory connected to the processor, wherein the semiconductor device comprises:

a first operation mode; and a second operation mode lower in a power consumption than the first operation mode, wherein the memory comprises a first memory mode and a second memory mode lower in the power consumption than first memory mode, and comprises a plurality of memory circuits including a first memory circuit and a second memory circuit, wherein the plurality of memory circuits includes a mode terminal supplied with a mode instruction signal specifying the first memory mode or the second memory mode, and a power supply terminal, respectively, and wherein the semiconductor device comprises:

a power supply line connected to the power supply terminal of each of the plurality of memory circuits; and a control circuit supplies the mode instruction signals specifying the first memory mode to the mode terminal of the first memory circuit in a transition period of the semiconductor device makes transition from the second operation mode to the first operation mode, and supplies the mode instruction signals specifying the first memory mode to the mode terminal of the second memory circuit after the semiconductor device makes transition to the first operation mode, in response to the transition from the second operation mode to the first operation mode.

2. The semiconductor device according to claim 1, wherein the first memory circuit includes a plurality of memory circuit to which the mode instruction signal specifying the first memory mode is supplied at different timings from each other.

3. The semiconductor device according to claim 2, wherein the processor starts operation by the transition to first operation mode, and the processor instructs the control circuit to provide the mode instruction signal to the second memory circuit.

4. The semiconductor device according to claim 3, further comprising:
a regulator connected to the power supply line and controlled by the control circuit.

5. A semiconductor device comprising:
a processor; and
a memory connected to the processor,
wherein the semiconductor device comprises:
    a first operation mode; and
    a second operation mode lower in a power consumption than the first operation mode,
wherein the memory comprises a first memory mode and a second memory mode lower in the power consumption than first memory mode, and comprises a plurality of memory circuits including a first memory circuit and a second memory circuit,
wherein the plurality of memory circuits includes a mode terminal supplied with a mode instruction signal specifying the first memory mode or the second memory mode, and a power supply terminal, respectively, and
wherein the semiconductor device comprises:
    a power supply line connected to the power supply terminal of each of the plurality of memory circuits; and
    a control circuit supplies the mode instruction signals specifying the first memory mode or the second memory mode to the mode terminal of the first memory circuit in a transition period of the semiconductor device makes transition the operation mode, and then supplies simultaneously the mode instruction signals specifying the first memory mode or the second memory mode to the mode terminal of at least two second memory circuit.

6. The semiconductor device according to claim 5, wherein the control circuit simultaneously supplies the mode instruction signal specifying the first memory mode or the second memory mode to the mode terminal of the second memory circuits, and then supplies substantially simultaneously the mode instruction signal specifying the first memory mode or the second memory mode to the mode terminal of at least two third memory circuits of the plurality of memory circuit.

7. The semiconductor device according to claim 6,
wherein the processor starts its operation in the transition from the second operation mode to the first operation mode, and
wherein the semiconductor device comprises a regulator connected to the power supply line and controlled by the control circuit.

8. A control method of a semiconductor device comprising a processor and a plurality of memory circuits connected to the processor,
wherein the plurality of memory circuits comprises a first memory mode and a second memory mode lower in a power consumption than the first memory mode,
wherein the semiconductor device comprises a first operation mode and a second operation mode lower in a power consumption than the first operation mode,
wherein the control method comprising the steps of:
    (a) transitioning a first memory circuit of the plurality of memory circuits from the second memory mode to the first memory mode, in a transition period from the second operation mode to the first operation mode; and
    (b) after step (a), transitioning a second memory circuit of the plurality of memory circuits from the second memory mode to the first memory mode in the first operation mode after the transition period,
wherein the step (a) is a first transition step, and
wherein the step (b) is a second transition step.

9. The control method according to claim 8, wherein the first memory circuit includes a plurality of memory circuits that transition from the second memory mode to the first memory mode at different timings in the first transition step.

10. The control method according to claim 9, wherein processor starts an operation during transition from the first transition step to the second transition step.

* * * * *